United States Patent
Sakai

(10) Patent No.: US 6,734,745 B2
(45) Date of Patent: May 11, 2004

(54) OSCILLATOR AND COMMUNICATION APPARATUS USING THE SAME

(75) Inventor: Ken Sakai, Komatsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/995,644

(22) Filed: Nov. 29, 2001

(65) Prior Publication Data

US 2002/0079977 A1 Jun. 27, 2002

(30) Foreign Application Priority Data

Dec. 27, 2000 (JP) .................................... 2000-398569
Sep. 28, 2001 (JP) .................................... 2001-300624

(51) Int. Cl.$^7$ .............................................. H03B 1/00
(52) U.S. Cl. ........................................ 331/74; 330/284
(58) Field of Search ................... 331/36 C, 74, 331/108 R, 108 D, 182, 183, 185; 330/283

(56) References Cited

U.S. PATENT DOCUMENTS 4,205,274 A * 5/1980 Tsukada ..................... 330/276
4,275,362 A * 6/1981 Harford ..................... 330/283
6,496,071 B1 * 12/2002 Xavier ....................... 330/283

* cited by examiner

*Primary Examiner*—Robert Pascal
*Assistant Examiner*—Joseph Chang
(74) *Attorney, Agent, or Firm*—Keating & Bennett, LLP

(57) ABSTRACT

A voltage control oscillator includes an oscillator circuit for oscillating in a plurality of frequency bands, an amplifier circuit for amplifying an oscillation signal from the oscillator circuit, a control terminal from which a control voltage is applied to the oscillator circuit, a power supply terminal of the oscillator circuit, a power supply terminal of the amplifier circuit, and an output terminal through which an output signal is output. The amplifier circuit includes a resistance changing unit connected between the emitter of an amplifier transistor and the ground, in which a resistor is connected in parallel to a series circuit including a resistor and a switch, so as to reduce current flow when an apparatus incorporating the oscillator is not working.

46 Claims, 3 Drawing Sheets

OSCILLATOR AND COMMUNICATION APPARATUS USING THE SAME

BACKGROUND OF THE INVENTION

1. Field of the Invention

The present invention relates to an oscillator and a communication apparatus including the same. More particularly, the present invention relates to an oscillator having a resistance changing unit which changes the magnitude of output signals, and also relates to a communication apparatus including the same.

2. Description of the Related Art

An oscillator, particularly, a voltage control oscillator capable of controlling an oscillation frequency with a voltage, is used as a local transmission source in a receiver or an intermediate-frequency signal source in a transmitter. In a communication apparatus having both a receiving function and a transmitting function, a single voltage control oscillator is commonly used by the receiver and the transmitter.

FIG. 6 is a block diagram of a voltage control oscillator module 50 according to the related art. The voltage control oscillator module 50 includes a voltage control oscillator 53 having an oscillator circuit 51 and an amplifier circuit 52 which amplifies an oscillation signal of the oscillator circuit 51, an attenuator circuit 54 for attenuating an output signal S1 from the voltage control oscillator 53 in response to a control signal, a control terminal 55 from which a control voltage is applied to the oscillator circuit 51, a power supply terminal 56 of the oscillator circuit 51 and the amplifier circuit 52, and an output terminal 57 through which a local oscillation signal is output.

The attenuator circuit 54 operates to pass or to attenuate the output signal S1 of the voltage control oscillator 53 by switching a switch SW51. Specifically, when a communication apparatus such as a cellular telephone system which carries the voltage control oscillator 53 does not work, the magnitude of an output signal $S_o$ from the output terminal 57 is reduced to a predetermined value or less. This prevents the output signal $S_o$ from leaking when the cellular telephone system is not working.

More specifically, the attenuator circuit 54 shown in FIG. 6 is a T-shaped attenuator including two resistors R51 and R52 that are connected in series to the output from the voltage control oscillator 53, and a resistor R53 connected between a node of the resistors R51 and R52 and the ground. The attenuator circuit 53 allows the amount of attenuation applied to the output signal S1 from the voltage control oscillator 53 to be set according to the values of resistors R51 to R53.

However, since the voltage control oscillator module 50 uses the external attenuation circuit 54 to attenuate the output signal S1 from the voltage control oscillator 53, the output signal S1 from the voltage control oscillator 53 must always be maximum. As a result, the current flowing to the voltage control oscillator 53 must be maximum, leading to a problem that the lifetime of the battery incorporated in the communication apparatus is severely reduced.

SUMMARY OF THE INVENTION

In order to overcome the problems described above, preferred embodiments of the present invention provide a voltage control oscillator that reduces current flow when an apparatus incorporating the voltage control oscillator does not work, and also provide a communication apparatus including such a voltage control oscillator.

According to one preferred embodiment of the present invention, an oscillator includes an oscillator circuit, and an amplifier circuit for amplifying an oscillation signal from the oscillator circuit, the oscillator circuit and the amplifier circuit being connected to each other. The amplifier circuit includes an amplifier transistor, and a resistance changing unit between the emitter of the amplifier transistor and the ground.

The oscillator circuit may oscillate while switching between a plurality of oscillation frequencies, and the resistance changing unit may be switched according to the oscillation frequencies of the oscillator circuit.

The resistance changing unit preferably includes a resistor and a switch.

In another preferred embodiment of the present invention, a communication apparatus includes at least one oscillator according to the preferred embodiment described above.

In an oscillator according to a preferred embodiment of the present invention, a resistance changing unit is preferably provided between the emitter of an amplifier transistor contained in an amplifier and the ground, thereby changing a current flowing between the emitter of the amplifier transistor and the ground.

A communication apparatus according to another preferred embodiment of the present invention includes at least one oscillator that reduces current flow, thereby extending the lifetime of the battery incorporated therein.

Other features, elements, characteristics and advantages of the present invention will become more apparent from the detailed description of preferred embodiments below with reference to the attached drawings.

DETAILED DESCRIPTION OF PREFERRED EMBODIMENTS

The present invention is described in conjunction with illustrative preferred embodiments with reference to the attached drawings.

Figure 1:
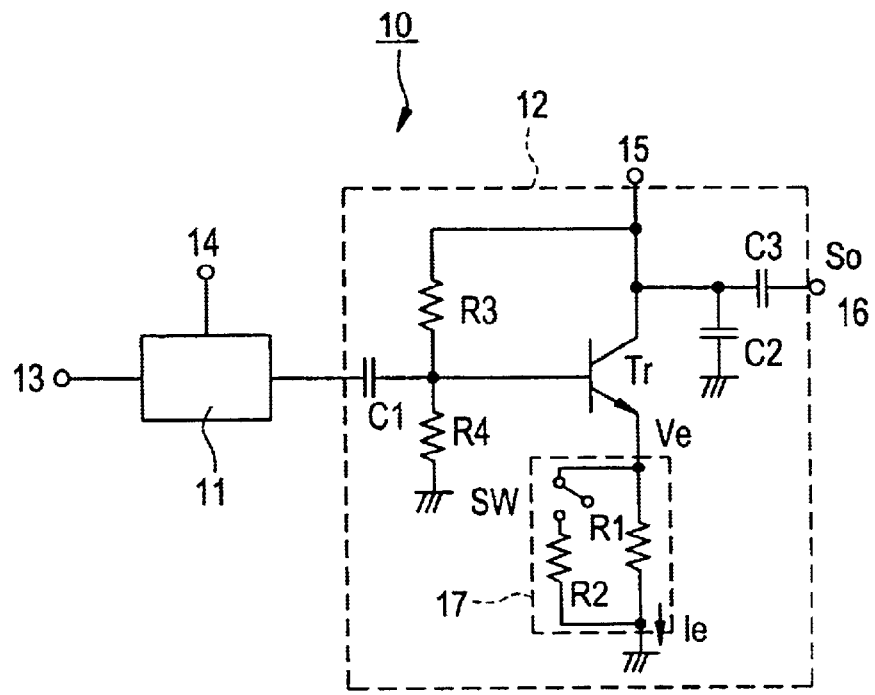
FIG. 1 is a circuit diagram of a voltage control oscillator according to a first preferred embodiment of the present invention.

FIG. 1 is a circuit diagram of a voltage control oscillator 10 according to a first preferred embodiment of the present invention. The voltage control oscillator 10 preferably includes an oscillator circuit 11, an amplifier circuit 12 for amplifying an oscillation signal from the oscillator circuit 11, a control terminal 13 from which a control voltage is applied to the oscillator circuit 11, a power supply 14 of the oscillator circuit 11, a power supply terminal 15 of the amplifier circuit 12, and an output terminal 16 through which an output signal $S_o$ is output.

The amplifier circuit 12 preferably includes an amplifier transistor Tr, capacitors C1 to C3, resistors R1 to R4, and a switch SW. The power supply terminal 15 is connected to the collector of the amplifier transistor Tr, and the collector of the amplifier transistor Tr is connected to the output terminal 16 via the capacitor C3, and is also connected to the ground via the capacitor C2.

The resistor R3 is connected between the collector and base of the amplifier transistor Tr, and the base of the amplifier transistor Tr is connected to the oscillator circuit 11 via the capacitor C1 and to the ground via the resistor R4.

Between the emitter of the amplifier transistor Tr and the ground, the resistor R1 is connected in parallel to a series circuit defined by the resistor R2 and the switch SW, thereby constituting a resistance changing unit 17. The switch SW is preferably a transistor or a switch diode in the present preferred embodiment.

In operation, in the amplifier circuit 12, when the switch SW of the resistance changing unit 17 is off, the resistance R between the emitter of the amplifier transistor Tr and the ground is equal to the resistance R1. If the switch SW of the resistance changing unit 17 is on, the resistance R between the emitter of the amplifier transistor Tr and the ground is defined by $R=(R1 \cdot R2)/(R1+R2)$.

Since a voltage $V_e$ at the emitter of the amplifier transistor Tr is constant unless the voltage applied from the power supply terminal 15 changes, a current $I_e$ flowing between the emitter of the amplifier transistor Tr and the ground can be changed by turning on and off the switch SW.

As the current $I_e$ between the emitter of the amplifier transistor Tr and the ground varies, the amplification factor of the amplifier transistor Tr varies, resulting in variations in magnitude of the output signal $S_o$ from the output terminal 16.

Figure 2:
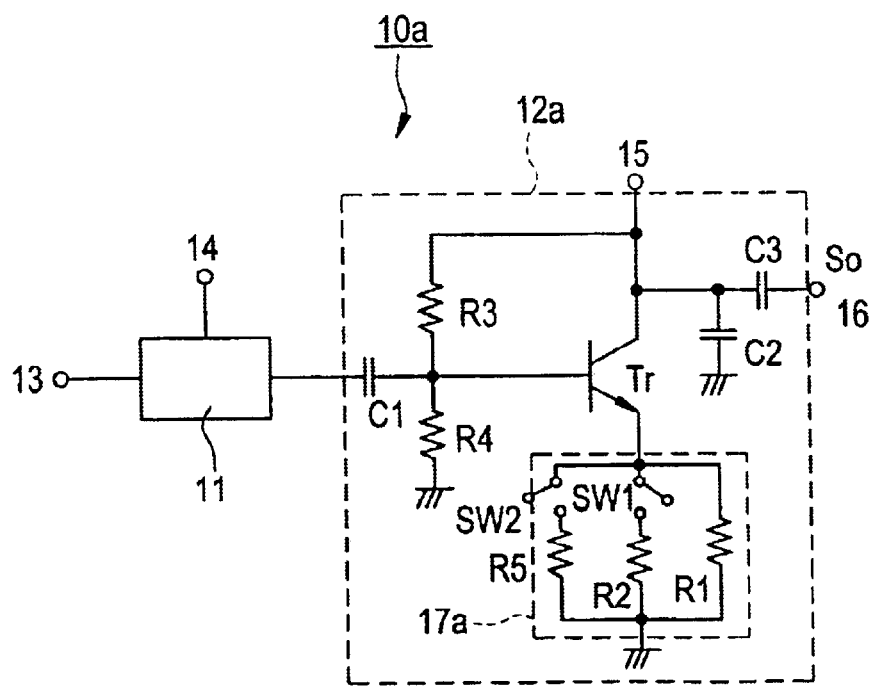
FIG. 2 is a circuit diagram of a modification of the voltage control oscillator shown in FIG. 1.

FIG. 2 is a circuit diagram of a modification of the voltage control oscillator 10 shown in FIG. 1. A modified voltage control oscillator 10a preferably includes an amplifier circuit 12a having a resistance changing unit 17a with a different structure from that of the voltage control oscillator 10 (see FIG. 1).

The resistance changing unit 17a is preferably constructed so that a resistor R1 is connected in parallel to two series circuits, one series circuit including a resistor R2 and a switch SW1 and the other series circuit being including a resistor R5 and a switch SW2.

In this case, as the number of series circuits each including a resistor and a switch increases, the resistance R between the emitter of the amplifier transistor Tr and the ground can be more finely adjusted. This results in a finer adjustment of amplitude of the output signal $S_o$ from the output terminal 16.

Figure 3:
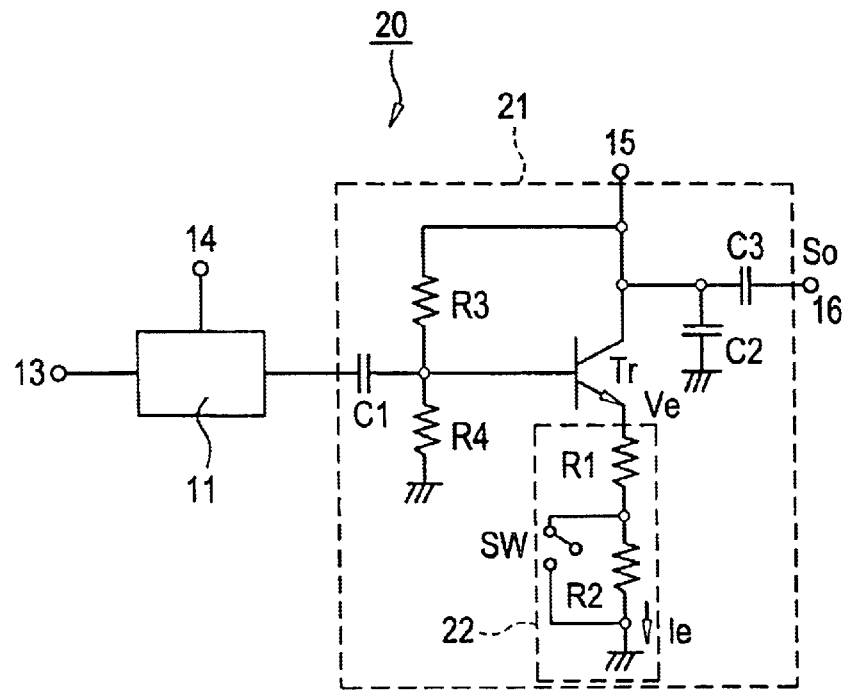
FIG. 3 is a circuit diagram of a voltage control oscillator according to a second preferred embodiment of the present invention.

FIG. 3 is a circuit diagram of a voltage control oscillator 20 according to a second preferred embodiment of the present invention. The voltage control oscillator 20 includes an amplifier circuit 21 having a resistance changing unit 22 with a different structure from the resistance changing unit 17 of the voltage control oscillator 10 (see FIG. 10) according to the first preferred embodiment of the present invention.

The resistance changing unit 22 is connected between the emitter of the amplifier transistor Tr and the ground, in which a resistor R1 is connected in series to a parallel circuit including a resistor R2 and a switch SW.

In operation, in the amplifier circuit 21, when the switch SW of the resistance changing unit 22 is off, the resistance R between the emitter of the amplifier transistor Tr and the ground is defined by $R=(R1+R2)$. If the switch SW of the resistance changing unit 22 is on, the resistance R between the emitter of the amplifier transistor Tr and the ground is equal to the resistance R1.

As in the voltage control oscillator 10 (see FIG. 1) according to the first preferred embodiment, since a voltage $V_e$ at the emitter of the amplifier transistor Tr is constant unless a voltage applied from the power supply terminal 15 changes, a current $I_e$ flowing between the emitter of the amplifier transistor Tr and the ground can be changed by turning on and off the switch SW.

As the current $I_e$ between the emitter of the amplifier transistor Tr and the ground varies, the amplification factor of the amplifier transistor Tr varies, resulting in variations in magnitude of the output signal $S_o$ from the output terminal 16.

Figure 4:
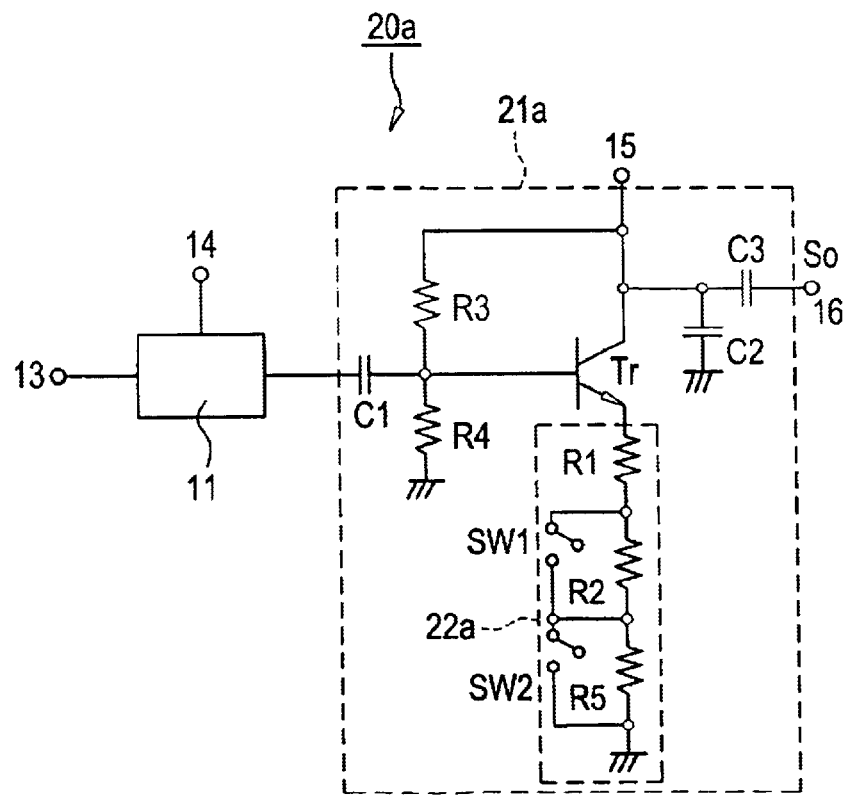
FIG. 4 is a circuit diagram of a modification of the voltage control oscillator shown in FIG. 3.

FIG. 4 is a circuit diagram of a modification of the voltage control oscillator 20 shown in FIG. 3. A modified voltage control oscillator 20a includes an amplifier circuit 21a having a resistance changing unit 22a with a different structure from that of the voltage control oscillator 20 (see FIG. 3) according to the second preferred embodiment of the present invention.

The resistance changing unit 22a is constructed so that a resistor R1 is connected in series to two parallel circuits, one parallel circuit including a resistor R2 and a switch SW1 and the other parallel circuit including a resistor R5 and a switch SW2.

In this case, as the number of series circuits each including a resistor and a switch increases, a resistance R between the emitter of the amplifier transistor Tr and the ground can be more finely changed. This results in more finely variations in amplitude of the output signal $S_o$ from the output terminal 16.

Accordingly, in the voltage control oscillator according to various preferred embodiments, a resistance changing unit is preferably provided between the emitter of an amplifier transistor included in an amplifier circuit and the ground, making it possible to change a current flowing between the emitter of the amplifier transistor and the ground.

Therefore, as the current flowing between the emitter of the amplifier transistor and the ground varies, the amplification factor of the amplifier transistor varies, resulting in variations in magnitude of the output signal from an output terminal. As a result, current flow can be reduced when an apparatus incorporating the voltage control oscillator is not working.

Although not shown in the figures, the oscillator circuit may oscillate while switching between a plurality of oscillation frequencies, and the resistance changing unit may be switched in response to the oscillation frequencies. As used herein, "switching between oscillation frequencies" does not mean that the oscillation frequency varies in a substantially continuous manner according to a control voltage applied to a voltage control oscillator, but that the oscillation frequency band significantly changes. Generally, an oscillator circuit capable of switching between oscillation frequency bands may often provide a varying magnitude of signal as the oscillation frequency varies. However, an oscillator according to various preferred embodiments of the present invention can provide signals of the same magnitude in all of the oscillation frequencies by switching the resistance changing unit according to the oscillation frequency. Otherwise, the magnitude of signal may be voluntarily different according to the oscillation frequencies.

While an oscillator according to various preferred embodiments of the present invention is illustrated and described as a voltage control oscillator in the illustrated embodiments, an oscillator having a fixed oscillation frequency can provide the same advantages.

Figure 5:
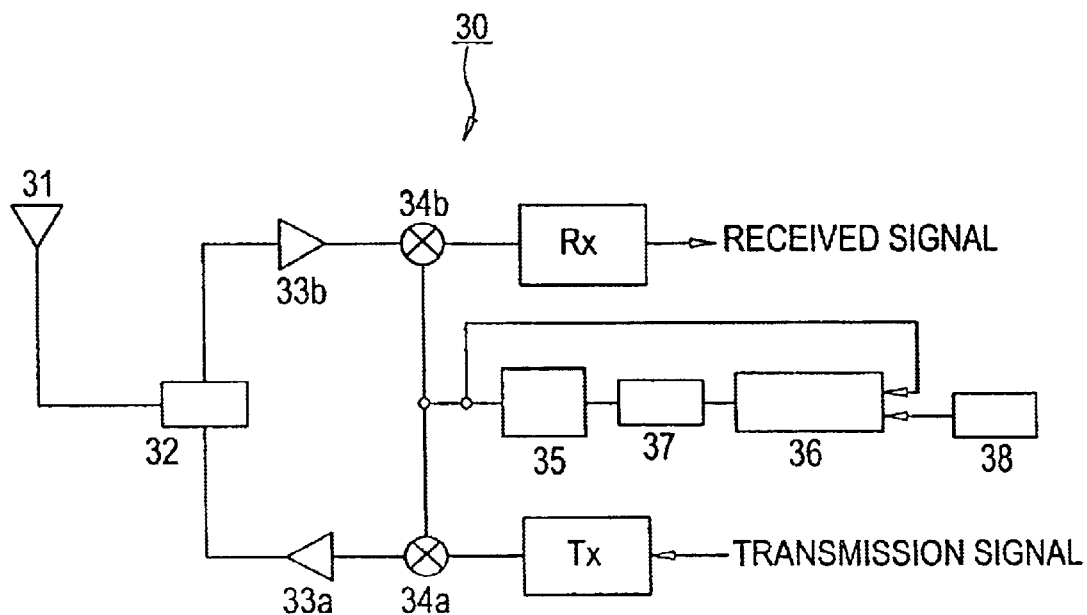
FIG. 5 is a block diagram of a communication apparatus according to another preferred embodiment of the present invention.
Figure 6:
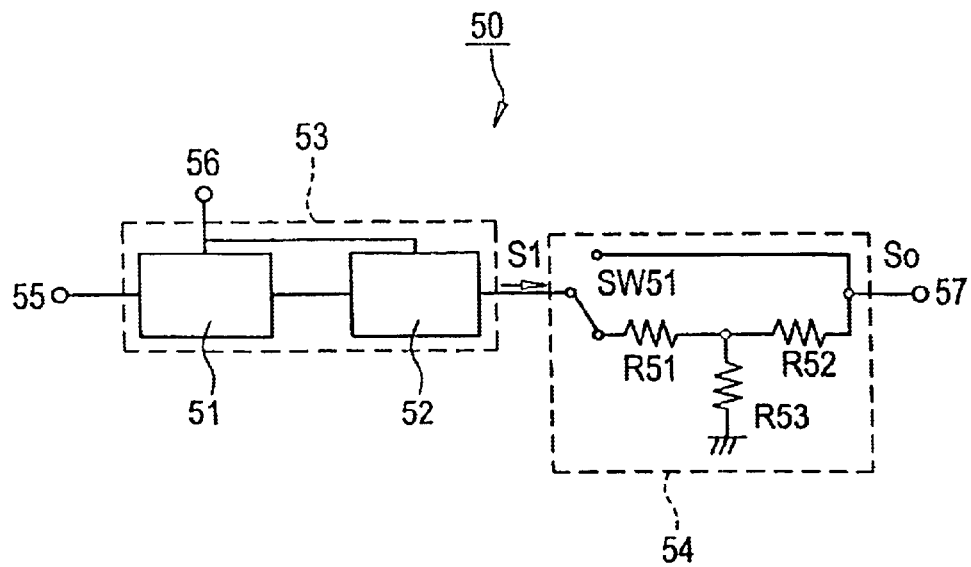
FIG. 6 is a block diagram of a voltage control oscillator module in the related art.

FIG. 5 is a block diagram of a communication apparatus 30 according to another preferred embodiment of the present invention. The communication apparatus 30 preferably includes an antenna 31, a duplexer 32, amplifiers 33a and 33b, mixer 34a and 34b, a voltage control oscillator 35, a PLL control circuit 36, a low-pass filter 37, a temperature-compensated quartz crystal oscillator 38, a transmitter Tx and a receiver Rx.

The PLL control circuit 36 receives the output signal from the voltage control oscillator 35, comparing it in phase with an oscillation signal from the temperature-compensated quartz crystal oscillator circuit 38, and outputs a control voltage so as to provide a desired frequency and phase.

The voltage control oscillator 35 receives the control voltage via the low-pass filter 37 at a control terminal, and outputs a high frequency signal according to the control voltage. This high frequency signal is applied to the mixers 34a and 34b as local oscillation signals.

The mixer 34a mixes an intermediate-frequency signal output from the transmitter Tx and the local oscillation signal, and converts the result into a transmission signal. This transmission signal is amplified by the amplifier 33a, and is then emitted from the antenna 31 via the duplexer 32.

A received signal from the antenna 31 is amplified by the amplifier 33b via the duplexer 32. The mixer 34b mixes the received signal that is amplified by the amplifier 33b and the location oscillation signal from the voltage control oscillator 35, and converts the result into an intermediate-frequency signal. This intermediate-frequency signal is processed by the receiver Rx.

The voltage control oscillator 35 in the communication apparatus 30 is preferably one of the voltage control oscillator 10, 10a, 20, or 20a according to the first or second preferred embodiment.

The communication apparatus according to the present preferred embodiment uses a voltage control oscillator, according to preferred embodiments described above, that reduces current flow, thereby extending the lifetime of the battery incorporated therein.

Accordingly, an oscillator according to preferred embodiments of the present invention includes a resistance changing unit preferably located between the emitter of an amplifier transistor included in an amplifier circuit and the ground, making it possible to change a current flowing between the emitter of the amplifier transistor and the ground.

As the current flowing between the emitter of the amplifier transistor and the ground varies, the amplification factor of the amplifier transistor varies, resulting in variations in magnitude of the output signal from an output terminal. As a result, current flow can be reduced when the apparatus incorporating the oscillator according to preferred embodiments of the present invention does not work.

A communication apparatus according to another preferred embodiment of the present invention preferably includes at least one oscillator that is constructed to reduce current flow, thereby extending the life of the battery incorporated therein.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. An oscillator comprising:
   an oscillator circuit;
   an amplifier circuit for amplifying an oscillation signal from said oscillator circuit, said oscillator circuit and said amplifier circuit being connected to each other and including a plurality of capacitors, a plurality of resistors and a switch; and
   a control terminal from which a control voltage is applied to the oscillator circuit, a power supply for the oscillator circuit, a power supply terminal for the amplifier circuit, and an output terminal through which an output signal is output; wherein
   said amplifier circuit includes an amplifier transistor, and a resistance changing unit located between the emitter of said amplifier transistor and ground; and
   one of the resistors is connected between a collector and base of the amplifier transistor, and a base of the amplifier transistor is connected to the oscillator circuit via one of the capacitors and to the ground via one of the resistors.

2. An oscillator according to claim 1, wherein the power supply terminal is connected to a collector of the amplifier transistor, and a collector of the amplifier transistor is connected to the output terminal via one of the plurality of capacitors, and is also connected to the ground via another one of the capacitors.

3. A communication apparatus comprising at least one oscillator according to claim 1.

4. An oscillator according to claim 1, wherein said oscillator circuit oscillates while switching between a plurality of oscillation frequencies, and said resistance changing unit is switched according to the oscillation frequencies of said oscillator circuit.

5. An oscillator according to claim 1, wherein said resistance changing unit includes a resistor and a switch.

6. A communication apparatus comprising at least one oscillator according to claim 5.

7. A communication apparatus comprising at least one oscillator according to claim 4.

8. An oscillator according to claim 1, wherein said resistance changing unit includes a resistor and a switch.

9. A communication apparatus comprising at least one oscillator according to claim 8.

10. An oscillator comprising:
    an oscillator circuit;
    an amplifier circuit for amplifying an oscillation signal from said oscillator circuit, said oscillator circuit and said amplifier circuit being connected to each other and including a plurality of capacitors, a plurality of resistors and a switch; and
    a control terminal from which a control voltage is applied to the oscillator circuit, a power supply for the oscillator circuit, a power supply terminal for the amplifier circuit, and an output terminal through which an output signal is output; wherein
    said amplifier circuit includes an amplifier transistor, and a resistance changing unit located between the emitter of said amplifier transistor and ground; and
    one of the resistors is connected in parallel to a series circuit defined by another one of the resistors and the switch so as to constitute the resistance changing unit.

11. An oscillator according to claim 10, wherein the switch is one of a transistor and a switch diode.

12. An oscillator according to claim 10, wherein the power supply terminal is connected to a collector of the amplifier transistor, and a collector of the amplifier transistor is connected to the output terminal via one of the plurality of capacitors, and is also connected to the ground via another one of the capacitors.

13. A communication apparatus comprising at least one oscillator according to claim 10.

14. An oscillator according to claim 10, wherein said resistance changing unit includes a resistor and a switch.

15. A communication apparatus comprising at least one oscillator according to claim 14.

16. An oscillator according to claims 10, wherein said oscillator circuit oscillates while switching between a plurality of oscillation frequencies, and said resistance changing unit is switched according to the oscillation frequencies of said oscillator circuit.

17. An oscillator according to claim 16, wherein said resistance changing unit includes a resistor and a switch.

18. A communication apparatus comprising at least one oscillator according to claim 17.

19. A communication apparatus comprising at least one oscillator according to claim 16.

20. An oscillator comprising:
an oscillator circuit;
an amplifier circuit for amplifying an oscillation signal from said oscillator circuit, said oscillator circuit and said amplifier circuit being connected to each other and including a plurality of capacitors, a plurality of resistors and a switch; and
a control terminal from which a control voltage is applied to the oscillator circuit, a power supply for the oscillator circuit, a power supply terminal for the amplifier circuit, and an output terminal through which an output signal is output; wherein
said amplifier circuit includes an amplifier transistor, and a resistance changing unit located between the emitter of said amplifier transistor and ground; and
one of the resistors is connected in parallel to first and second series circuits so as to constitute the resistance changing unit, the first series circuit being defined by a second one of the resistors and the switch and the second series circuit being defined by a third one of the resistors and another switch.

21. An oscillator according to claim 20, wherein the power supply terminal is connected to a collector of the amplifier transistor, and a collector of the amplifier transistor is connected to the output terminal via one of the plurality of capacitors, and is also connected to the ground via another one of the capacitors.

22. A communication apparatus comprising at least one oscillator according to claim 20.

23. An oscillator according to claim 20, wherein said resistance changing unit includes a resistor and a switch.

24. A communication apparatus comprising at least one oscillator according to claim 23.

25. An oscillator according to claim 20, wherein said oscillator circuit oscillates while switching between a plurality of oscillation frequencies, and said resistance changing unit is switched according to the oscillation frequencies of said oscillator circuit.

26. A communication apparatus comprising at least one oscillator according to claim 25.

27. An oscillator according to claim 25, wherein said resistance changing unit includes a resistor and a switch.

28. A communication apparatus comprising at least one oscillator according to claim 27.

29. An oscillator comprising:
an oscillator circuit;
an amplifier circuit for amplifying an oscillation signal from said oscillator circuit, said oscillator circuit and said amplifier circuit being connected to each other and including a plurality of capacitors, a plurality of resistors and a switch; and
a control terminal from which a control voltage is applied to the oscillator circuit, a power supply for the oscillator circuit, a power supply terminal for the amplifier circuit, and an output terminal through which an output signal is output; wherein
said amplifier circuit includes an amplifier transistor, and a resistance changing unit located between the emitter of said amplifier transistor and ground; and
one of the resistors is connected in series to a parallel circuit defined by another one of the resistors and the switch so as to constitute the resistance changing unit.

30. An oscillator according to claim 29, wherein the power supply terminal is connected to a collector of the amplifier transistor, and a collector of the amplifier transistor is connected to the output terminal via one of the plurality of capacitors, and is also connected to the ground via another one of the capacitors.

31. A communication apparatus comprising at least one oscillator according to claim 29.

32. An oscillator according to claim 29, wherein said resistance changing unit includes a resistor and a switch.

33. A communication apparatus comprising at least one oscillator according to claim 32.

34. An oscillator according to claim 29, wherein said oscillator circuit oscillates while switching between a plurality of oscillation frequencies, and said resistance changing unit is switched according to the oscillation frequencies of said oscillator circuit.

35. A communication apparatus comprising at least one oscillator according to claim 34.

36. An oscillator according to claim 34, wherein said resistance changing unit includes a resistor and a switch.

37. A communication apparatus comprising at least one oscillator according to claim 36.

38. An oscillator comprising:
an oscillator circuit;
an amplifier circuit for amplifying an oscillation signal from said oscillator circuit, said oscillator circuit and said amplifier circuit being connected to each other and including a plurality of capacitors, a plurality of resistors and a switch; and
a control terminal from which a control voltage is applied to the oscillator circuit, a power supply for the oscillator circuit, a power supply terminal for the amplifier circuit, and an output terminal through which an output signal is output; wherein
said amplifier circuit includes an amplifier transistor, and a resistance changing unit located between the emitter of said amplifier transistor and ground; and
one of the resistors is connected in series to first and second parallel circuits so as to constitute the resistance changing unit, the first parallel circuit being defined by a second one of the resistors and the switch and the second parallel circuit being defined by a third one of the resistors and another switch.

39. An oscillator according to claim 38, wherein the power supply terminal is connected to a collector of the amplifier transistor, and a collector of the amplifier transistor is connected to the output terminal via one of the plurality of capacitors, and is also connected to the ground via another one of the capacitors.

40. A communication apparatus comprising at least one oscillator according to claim 38.

41. An oscillator according to claim 38, wherein said resistance changing unit includes a resistor and a switch.

42. A communication apparatus comprising at least one oscillator according to claim 41.

43. An oscillator according to claim 38, wherein said oscillator circuit oscillates while switching between a plurality of oscillation frequencies, and said resistance changing unit is switched according to the oscillation frequencies of said oscillator circuit.

44. A communication apparatus comprising at least one oscillator according to claim 43.

45. An oscillator according to claim 43, wherein said resistance changing unit includes a resistor and a switch.

46. A communication apparatus comprising at least one oscillator according to claim 45.

* * * * *